United States Patent
Izumi

(10) Patent No.: US 7,095,005 B2
(45) Date of Patent: Aug. 22, 2006

(54) IMAGE READING DEVICE FOR REVERSING POLARITY OF STORED CHARGE IN CAPACITOR

(75) Inventor: Yoshihiro Izumi, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 226 days.

(21) Appl. No.: 10/695,386

(22) Filed: Oct. 29, 2003

(65) Prior Publication Data

US 2004/0090405 A1    May 13, 2004

(30) Foreign Application Priority Data

Nov. 12, 2002    (JP) .............................. 2002-328839

(51) Int. Cl.
*H03F 3/08* (2006.01)
*H04N 3/14* (2006.01)
*H04N 5/335* (2006.01)

(52) U.S. Cl. ............................. 250/214 R; 250/214 A; 348/300; 348/307

(58) Field of Classification Search ............ 250/214 R, 250/214.1, 214 A, 208.1; 257/290, 291; 348/300–304, 307
See application file for complete search history.

(56) References Cited

U.S. PATENT DOCUMENTS 5,184,007 A * 2/1993 Saika et al. .............. 250/208.1
5,912,465 A   6/1999 Kobayashi et al. .... 250/370.09
6,738,031 B1 * 5/2004 Young et al. ................. 345/55

FOREIGN PATENT DOCUMENTS

| JP | 8055/1990 | 1/1990 |
|----|-----------|--------|
| JP | 05243547 A * | 9/1993 |
| KR | 2001-0081036 | 8/2001 |

OTHER PUBLICATIONS

Chinese Office Action and English translation thereof mailed Jul. 1, 2005 in corresponding Chinese application No. 200310114379.0.
WO 01/24512 dated Apr. 5, 2001 (family patent of KR2001-0081036 listed above).
Korean Office Action mailed Oct. 28, 2005 (w/English translation thereof).

* cited by examiner

*Primary Examiner*—Thanh X. Luu
*Assistant Examiner*—Stephen Yam
(74) *Attorney, Agent, or Firm*—Nixon & Vanderhye P.C.

(57) ABSTRACT

In an image reading device of the present invention, the polarity of a driving voltage for a Cs electrode is reversed every reading cycle (frame). For example, the Cs electrode is driven by positively charging the capacitor in odd-numbered cycles (frames) and by negatively charging the capacitor in even-numbered cycles (frames). As a result, an image reading device is provided that does not readily change electrical characteristics of the capacitor or TFT, and therefore are reliable over extended periods of use.

11 Claims, 12 Drawing Sheets

IMAGE READING DEVICE FOR REVERSING POLARITY OF STORED CHARGE IN CAPACITOR

FIELD OF THE INVENTION

The present invention relates to image reading devices for reading images such as a document and photograph, and particularly to image reading devices using a photosensitive thin-film transistor (TFT) for a photo-detecting element.

BACKGROUND OF THE INVENTION

Conventionally, there has been developed a two-dimensional image sensor (image reading device) of an active-matrix type in which a photo-detecting element (photo diode, photo transistor) and a switching element (thin-film transistor) are disposed on a two-dimensional plane, as disclosed in Japanese Utility Model Application No. 8055/1990 (Jitsukaihei 2-8055; published on Jan. 18, 1990).

Such a two-dimensional image sensor has an active-matrix array (active-matrix substrate), as shown in FIG. 9, including source lines s1, s2, . . . , sm, and gate lines g1, g2, . . . , gn intersecting with each other, and pixels that are arrayed in an X-Y matrix at the intersections of these lines. Each pixel has a photo-detecting TFT (photo-detecting thin-film transistor), a switching TFT (switching thin-film transistor), and a capacitor.

The two-dimensional image sensor reads a document image by projecting light onto a document while the resistance across the source and drain electrodes are high, i.e., when the photosensor TFT is OFF with the voltage of the gate electrode set to Vg1. When the reflected light from the surface of the document is incident on the photosensor TFT, the resistance value of the photosensor TFT decreases, causing the source-drain current to vary from a dark current (Idark) to a photo current (Iphoto), as shown in FIG. 10.

By taking advantage of this principle; the magnitude of source-drain current is varied according to the brightness of the irradiated object (document), i.e., the reflectance of the light. The difference between Idark and Iphoto determines the amount of charge stored in or discharged from the capacitor of each pixel.

The switching TFTs are used to sequentially read the charge distribution (in-plane distribution) of the capacitors, thereby obtaining two-dimensional information of the object.

However, conventional image reading devices as exemplified by the foregoing two-dimensional image sensor have the following problem.

In conventional image reading devices, when the driving voltage of the Cs electrode maintains the same polarity throughout the reading cycles (frames), stress caused by a DC-bias is applied to the TFT element or capacitor when the device is used for an extended time period, with the result that the electrical characteristics of the TFT element or capacitor are changed.

More specifically, the potential of the capacitor fluctuates or the polarity symmetry is disturbed, though to a limited extent, by the influence of the charge captured in an insulating film as a result of the DC-bias stress.

Thus, conventional image reading devices pose the problem of reliability when used over extended periods of time.

SUMMARY OF THE INVENTION

The present invention was made in view of the foregoing problem, and it is an object of the present invention to provide an image reading device that does not readily change electrical characteristics of the capacitor or TFT, and therefore is reliable over extended periods of use.

In order to achieve this object, an image reading device of the present invention includes: a photoelectric conversion element including a photosensitive thin-film transistor and a capacitor connected to a drain electrode of the photosensitive thin-film transistor; a photoelectric conversion amount detecting section for detecting an amount of charge stored in the capacitor that varies according to intensity of light projected on the photosensitive thin-film transistor; and a control section for reversing the polarity of the stored charge in the capacitor with respect to a potential of the source electrode of the photosensitive thin-film transistor.

According to this structure, the control section reverses an applied driving voltage to the Cs electrode (capacitor electrode opposite the electrode connected to the drain electrode), for example, every frame, so as to reverse the polarity of the stored charge in the capacitor, thereby reversing the polarity of the stored charge in the capacitor every frame. As a result, a DC-bias stress will not be applied to the thin-film transistor (TFT element) or capacitor, thus realizing an image reading device with good reliability that does not undergo change in electrical characteristics even after extended periods of use.

In conventional image reading devices, the driving voltage applied to the Cs electrode to read a document image maintains the same polarity throughout the reading operation. As a result, a DC-bias stress is applied to the TFT element or capacitor, changing the electrical characteristics of the TFT element or capacitor and thereby causing the problem of reliability in the image leading device.

In order to prevent this problem, the image reading device of the present invention drives the Cs electrode in such a manner as to store charges of both positive and negative polarities in the capacitor. As a result, a DC-bias stress due to an input signal to the Cs electrode will not be applied to the TFT element or capacitor, thus realizing an image reading device with good reliability that does not undergo change in electrical characteristics of the TFT element or capacitor even after extended periods of use.

It is preferable that the control section reverses the polarity of the stored charge in the capacitor every image reading cycle, or every multiple image reading cycles.

By thus reversing the polarity of the stored charge in the capacitor every image reading cycle or every multiple image reading cycles, a change in electrical characteristic of the TFT element or capacitor is prevented, and an image reading device with good reliability is realized.

For a fuller understanding of the nature and advantages of the invention, reference should be made to the ensuing detailed description taken in conjunction with the accompanying drawings.

DESCRIPTION OF THE INVENTION

First Embodiment

Referring to FIG. 1 through FIG. 7, the following describes an image reading device and an image reading method according to one embodiment of the present invention.

Figure 2:
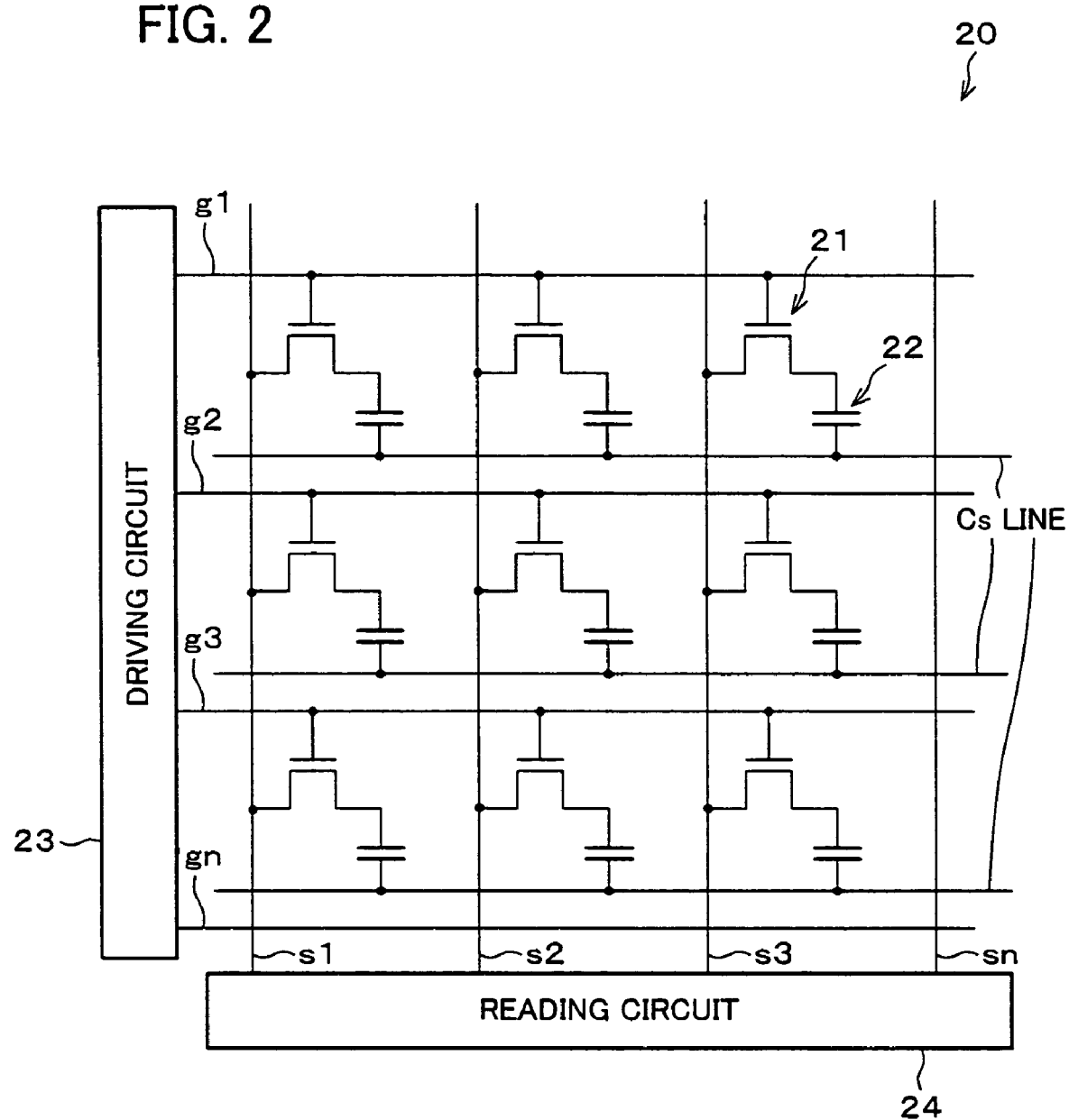
FIG. 2 is a circuit diagram schematically showing a structure of the image reading device of the present invention.

As illustrated in FIG. 2, an image reading device 20 of the present embodiment includes TFT elements 21 that serve as a photo-detecting TFT and a switching TFT.

The image reading device 20 includes: gate lines g1 through gn (simply "g" hereinafter) and source lines s1 through sn (simply "s" hereinafter) intersecting with each other; capacitor lines Cs provided parallel to the gate lines g; a TFT element (thin-film transistor) 21 and a pixel capacitor (capacitor) 22 provided at each intersection of the gate lines g and the source lines s; a driving circuit 23 connected to the gate lines 23; and a reading circuit 24 connected to the source lines s.

Figure 3:
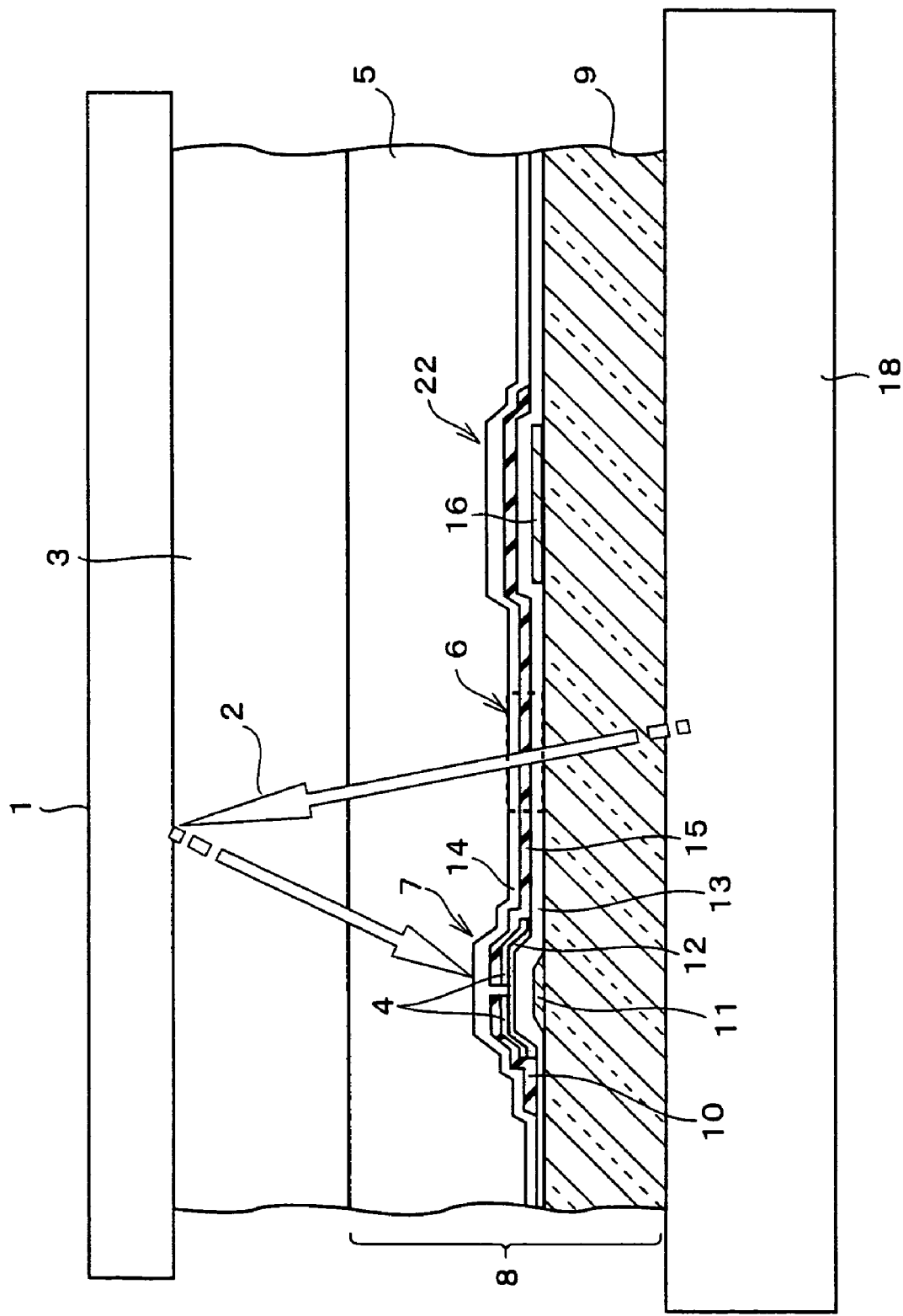
FIG. 3 is a cross sectional view showing a TFT portion of the image reading device of FIG. 2.

Referring to FIG. 3, description is made below as to a photo-detecting thin-film transistor realizing the TFT element 21. FIG. 3 is a cross sectional view of the image reading device 20 for one pixel.

A photo-detecting thin-film transistor 7 is a thin-film transistor of a reverse staggered-type (may be of a staggered-type when an upper gate electrode is made of a light transmissive material). A gate electrode 11 of a material such as aluminum (Al) or tantalum (Ta) is formed on an insulating substrate 9, and a gate insulating film 13 made of silicon nitride (SiN) is formed over the gate electrode 11 and the insulating substrate 9.

On the gate electrode 11 is formed a semiconductor layer (photosensitive semiconductor layer) 12 made of an i-type amorphous silicon (i-a-Si), opposite the gate electrode 11. On the semiconductor layer 12 are formed a source electrode 10 and a drain electrode 15, which are spaced apart opposite from each other by a predetermined distance.

The source electrode 10 and the drain electrode 15 are connected to the semiconductor layer 12 via an n$^+$ silicon layer 4.

On the source electrode 10 and the drain electrode 15 are formed an insulating film 14 (protective layer), making up the transistor (reverse staggered thin-film transistor). In FIG. 3, indicated by 5 is a protective film (or planarizing film), 3 is a protective base (or document plate), and 8 is a photoelectric conversion element. Further, in FIG. 3, indicated by 16 is a Cs electrode connected to a capacitor line Cs formed on the same level as the gate electrode 11. A pixel capacitor 22 is provided where the Cs electrode 16 is provided.

A backlight 18 provided on the side of the insulating substrate 9 emits illumination light 2. The illumination light 2 emitted by the backlight 18 passes through an opening 6 and reflects on a document 1 into the semiconductor layer 12 of the photo-detecting thin-film transistor 7.

The photo-detecting thin-film transistor 7 carries out ON/OFF control by controlling an applied voltage to the gate electrode 11. For example, when a positive voltage is applied to the gate electrode 11 of the photo-detecting thin-film transistor 7, an n-channel is formed in the semiconductor layer 12. Here, applying a voltage across the source electrode 10 and the drain electrode 15 causes current to flow across the source electrode 10 and the drain electrode 15.

Figure 10:
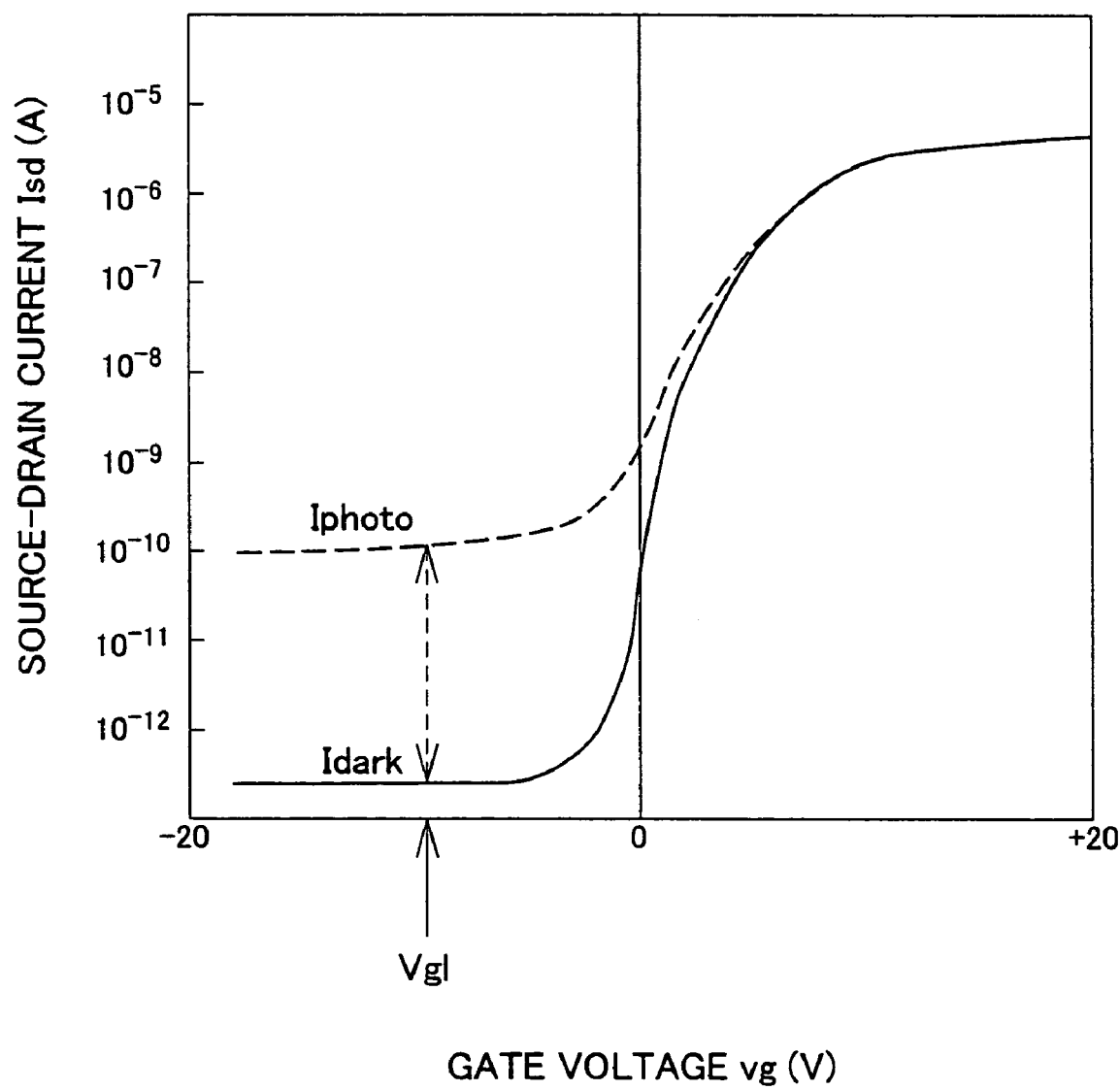
FIG. 10 is a graph representing a relationship between gate voltage and source-drain current, which is a common characteristic of a photo-detecting TFT.

FIG. 10 is a graph representing a relationship between gate voltage and drain current of the photo-detecting thin-film transistor 7. Curve Iphoto is plotted by a gate voltage and drain current of a pixel irradiated with light, and curve Idark is plotted by a gate voltage and drain current of a pixel not irradiated with light.

As indicated by curve Iphoto in FIG. 10, in an OFF state (under applied negative voltage to the gate electrode 11) in which light is projected, carriers are induced in the semiconductor layer 12, causing a drain current to flow across the source electrode 10 and the drain electrode 15 according to the number of holes induced by the projected light, i.e., the quantity of the projected light. When no light is projected, the drain current is extremely small, as indicated by curve Idark in FIG. 10. For example, the dark current may be as small as $10^{-14}$ A (ampere).

As a result, in the photo-detecting thin-film transistor 7, a large difference is created between the drain current under light (Iphoto) and the drain current under no light (Idark). The difference can be made even greater by accumulating the drain current under light and the drain current under no light for a predetermined time period, making it possible to provide a photoelectric converter 8 having a wide dynamic range.

As described herein, the photo-detecting thin-film transistor 7 is a thin-film transistor of a reverse staggered-type. However, the photo-detecting thin-film transistor 7 may be of a staggered-type when an upper gate electrode is made of a light transmissive material.

Referring to the flowchart of FIG. 4, a driving method of the image reading device 20 of the present embodiment is described below.

Figure 4:
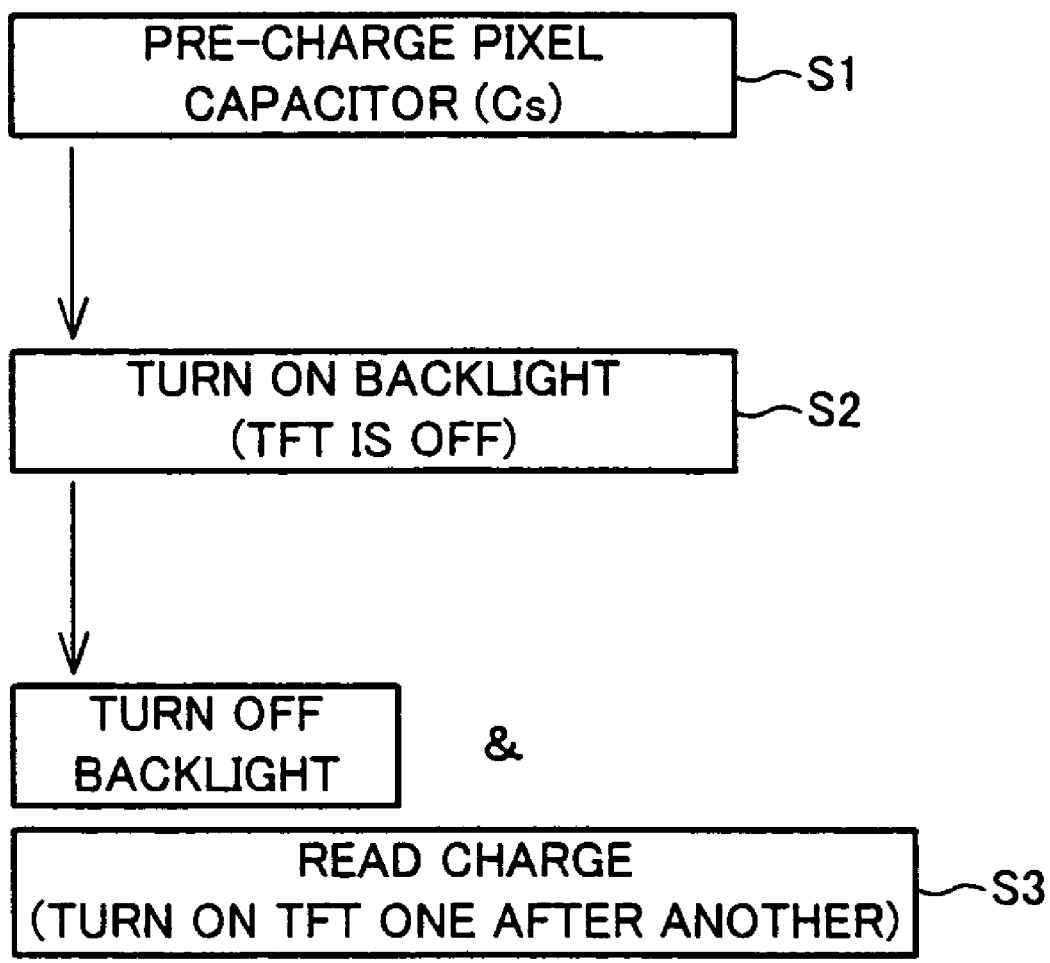
FIG. 4 is a flow chart showing an image reading operation of the image reading device of FIG. 2.

To read a document image, the image reading device 20 follows basic steps 1 through 3 below (steps will be abbreviated to S hereinafter), as shown in FIG. 4.

In Si, in order to pre-charge the pixel capacitors 22, the pixel capacitors 22 are charged to a: predetermined level using the source lines s or the capacitor lines Cs.

In S2, the backlight 18 is turned ON, and the stored charge in the pixel capacitors 22 is liberated through the TFT elements 21 for a predetermined time period. Here, as shown in FIG. 10, pixels under light output a source-drain current Iphoto, and pixels under no light output a source-drain current Idark.

In S3, the backlight 18 is turned OFF, and the charge remaining in the pixel capacitors 22 is detected by the reading circuit 24 connected to the source lines s, thereby obtaining image information corresponding to the target document image.

Note that, more than one document image may be read one after another by repeating the foregoing S1 through S3.

Figure 5:
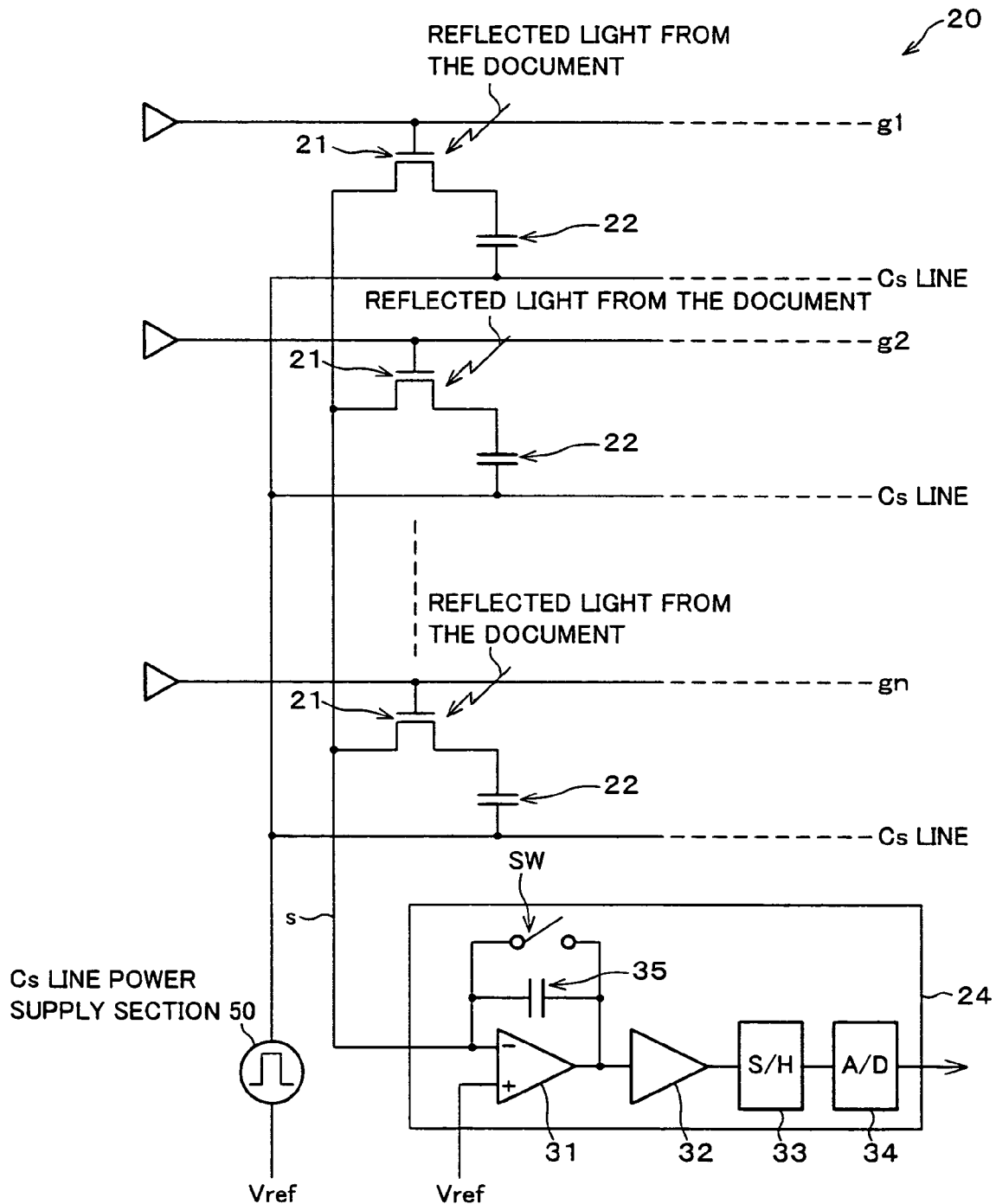
FIG. 5 is a circuit diagram showing an equivalent circuit, corresponding to a single source line, and a reading circuit in the image reading device of FIG. 2.

Referring to FIG. 5, description is made below as to an equivalent circuit for one of the source lines s of the matrix lines shown in FIG. 2, and the reading circuit (photoelectric conversion amount detecting means, photoelectric conversion amount detecting section) 24 connected to this source line s.

The reading circuit 24 includes a charge integration circuit (CSA) 31, an amplifier 32, and a sample-and-hold circuit (S/H circuit) 33, etc., for the number of lines (e.g., several hundred lines) detected by the reading circuit 24. On a subsequent stage of the S/H circuit 33, there is provided an analog/digital converter circuit ("A/D converter" hereinafter) 34 via an analog multiplexer (not shown).

The output of the CSA 31 is supplied to the amplifier 32 where the input signal is amplified by a predetermined factor before it is outputted. Note that, a low-pass filter for cutting a noise component may be interposed between the CSA 31 and the amplifier 32.

The output of the amplifier 32 is supplied to the S/H circuit 33, held therein, and outputted to one of the input terminals of the analog multiplexer.

The output of the analog multiplexer is supplied to the A/D converter 34 on the next stage. The A/D converter 34 carries out A/D conversion of the data before it is outputted to outside.

A Cs line power supply section 50 reverses the polarity of the driving voltage for the Cs electrode. Further, by thus driving the Cs electrode by reversing the polarity of the driving voltage for the Cs electrode, the Cs line power supply section 50 pre-charges the pixel capacitors 22. As a result, the polarity of the stored charge in the pixel capacitor 22 is reversed every predetermined time period with respect to the potential of the source electrode 10. That is, the Cs line power supply section 50 serves as a control section and control means of the present invention.

Figure 6:
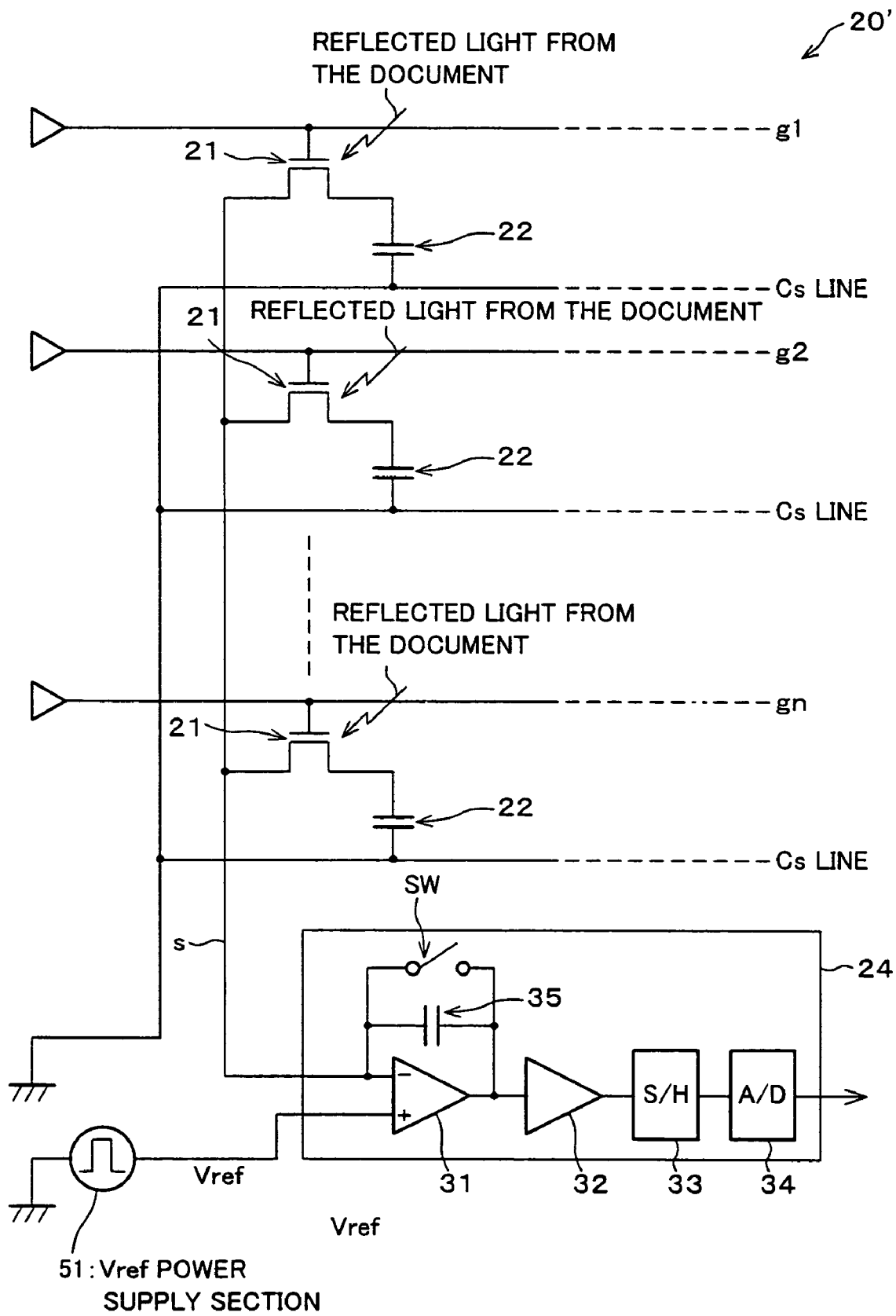
FIG. 6 is a circuit diagram showing another example of the equivalent circuit and reading circuit shown in FIG. 5.

Note that, even though FIG. 5 described the image reading device 20 in which the pixel capacitors 22 are pre-charged by driving the Cs electrode, the present invention is not just limited to this implementation. For example, as illustrated in FIG. 6, the pixel capacitors 22 may be pre-charged by driving a reference potential Vref of the CSA 31, as in an image reading device 20' shown in FIG. 6. Here, because the pixel capacitors 22 and the source lines s are connected to each other via the TFT elements 21, the pixel capacitors 22 are charged through the source lines s when the TFT elements 21 are turned ON. The potential of the source lines s is controlled to be equal to or nearly equal to the reference voltage Vref of the CSA 31, and therefore the pixel capacitors 22 are charged with the reference voltage Vref of the CSA 31. That is, in this case, a Vref power supply section 51 serves as the control section and control means of the present invention.

In the following, operations of the image reading device 20 will be described more specifically with reference to the flowchart shown in FIG. 4, and the time chart shown in FIG. 1.

First, pre-charging of the pixel capacitor 22 is described that occur at time t4 through time t7 of the time chart, corresponding to S1 of the flowchart shown in FIG. 4.

When a reset switch SW of the CSA 31 is turned ON at time t4, a feedback capacitor 35 (see FIG. 5) of the CSA 31 is shorted and the output of the CSA 31 becomes a reference voltage Vref. Accordingly, the output of the amplifier 32 is also Vref. In this state, when the driving voltage for the Cs electrode is turned ON at time t5, the stored charge in the pixel capacitor 22 flows into the drain of the TFT element 21. It should be noted here that the charge disappears when the TFT element 21 is ON, because the CSA 31 is reset in this case.

The pixel capacitor 22 is pre-charged when the gate driving signal is turned OFF at time t6 and when the Cs electrode driving voltage is turned OFF at time t7, causing the potential of the pixel capacitor 22 to vary.

An operation during an ON period of the backlight 18 is described below that occurs at time t7 through time t1 of the time chart, corresponding to S2 of the flowchart shown in FIG. 4.

The stored charge in the pixel capacitor 22 is maintained for the duration of time t7 through time t1, i.e., until the start of the next cycle, because the TFT element 21 is OFF at time t7. Here, the time constant that maintains the stored charge in the pixel capacitor 22 is determined by a value of the OFF resistance and a value of the pixel capacitor 22 of the TFT element 21.

During the time period from time t7 to time t1, the backlight 18 is turned ON for a predetermined time period to project light onto a document 1.

Here, the resistance values of the TFT elements 21 are reduced in pixels irradiated with light, causing the stored charge in the pixel capacitors 22 to flow into the respective sources of the TFT elements 21, and the TFT-drain voltage approaches Vref. On the other hand, in pixels not irradiated with light, the TFT elements 21 maintain high resistance values, and the stored charge in the pixel capacitors 22 are maintained, causing no large change in the TFT-drain voltage. As a result, during the time period from time t7 to time t1, the drain voltage of the TFT element 21, i.e., the amount of remaining charge in the pixel capacitor 22 becomes different among pixels irradiated with light and pixels not irradiated with light.

Next, a charge reading operation is described below that occurs in time t1 through time t4 of the time chart, corresponding to S3 of the flowchart shown in FIG. 4.

At time t1, the reset switch SW of the CSA 31 is turned OFF to terminate the reset state of the CSA 31. At time t2, the gate signal line is turned ON-to turn ON the TFT elements 21.

With the TFT elements 21 turned ON, the charge in the pixel capacitor 22 of each pixel migrates to the feedback capacitor 35 of the CSA 31. This determines the output value of the CSA 31. The output of the CSA 31 takes the form as indicated by a solid line in FIG. 1 for pixels irradiated with light, and the form as indicated by a broken line in FIG. 1 for pixels not irradiated with light.

The output value of the amplifier 32 is the product of the output value of the CSA 31 and a gain (G). At time t3, the S/H circuit 33 samples and holds this value. As a result, an electrical signal is obtained that is based on image information of the document obtained during the light irradiation period.

While reading data, no light is projected to avoid any adverse effect on the operation of the TFT elements 21. After reading data, the reset switch SW of the CSA 31 is turned ON at time t4.

A document image is thus read in steps S1 through S3.

Image information of multiple document images may be read one after another by repeating S1 through S3. Further, a color image may be read by separately and sequentially emitting three primary colors of R, G, and B when projecting light.

Figure 1:
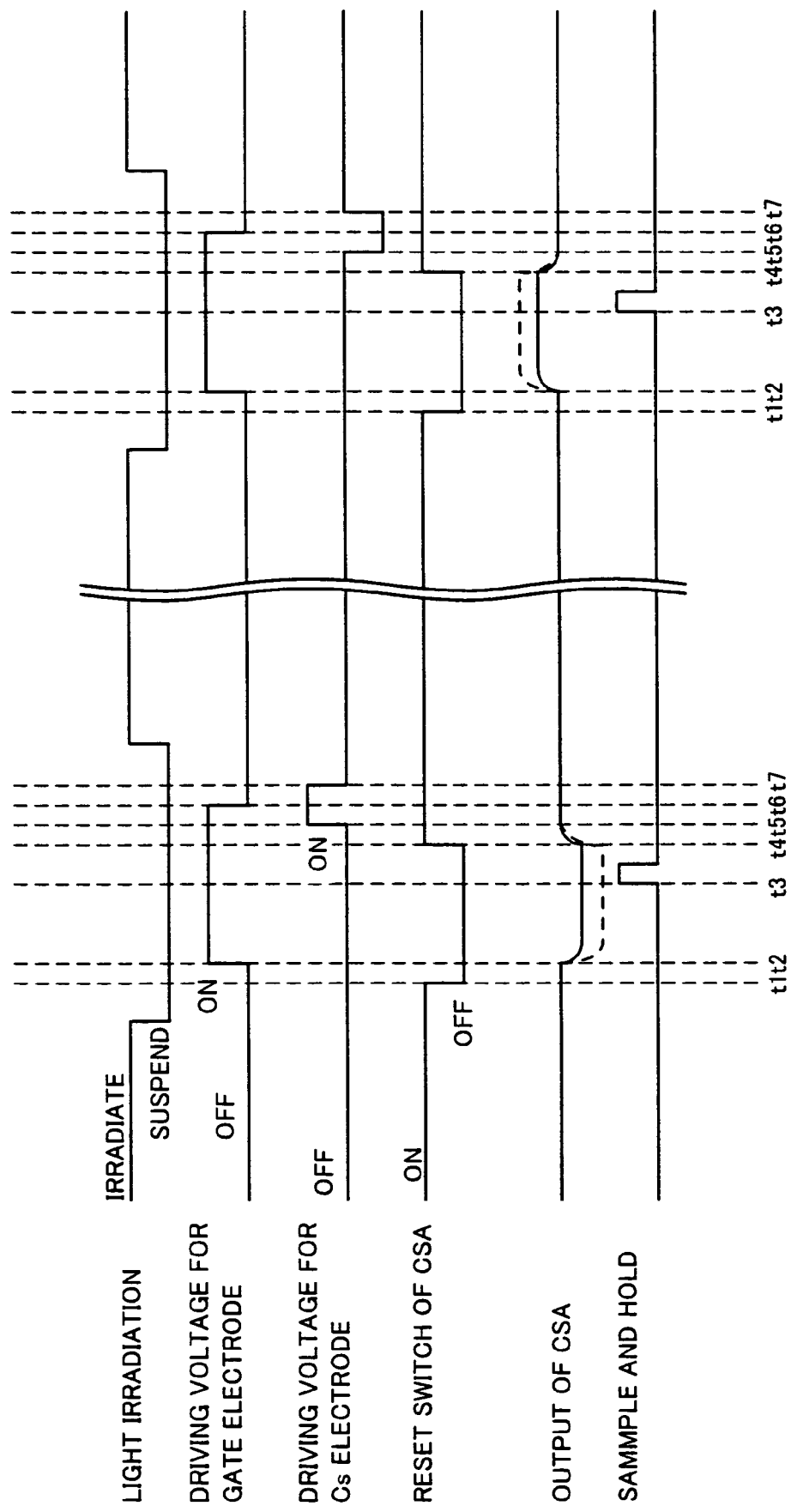
FIG. 1 is a timing chart representing Cs reverse driving in one pixel when reading a document image in an image reading device according to one embodiment of the present invention.

In the image reading device 20 of the present embodiment, the polarity of the driving voltage for the Cs electrode is reversed every reading cycle (frame), as shown in FIG. 1. For example, in order to drive the Cs electrode, the pixel capacitor 22 is positively charged in odd-numbered cycles (frames), and is negatively charged in even-numbered cycles (frames).

By thus driving the Cs electrode with the driving voltage of opposite polarities, no DC-bias will be applied to the TFT elements 21 or the pixel capacitors 22, and there accordingly will be no change in the electrical characteristics of the TFT elements 21 or the pixel capacitors 22, thereby providing an image reading device that are reliable over extended periods of use.

Figure 7:
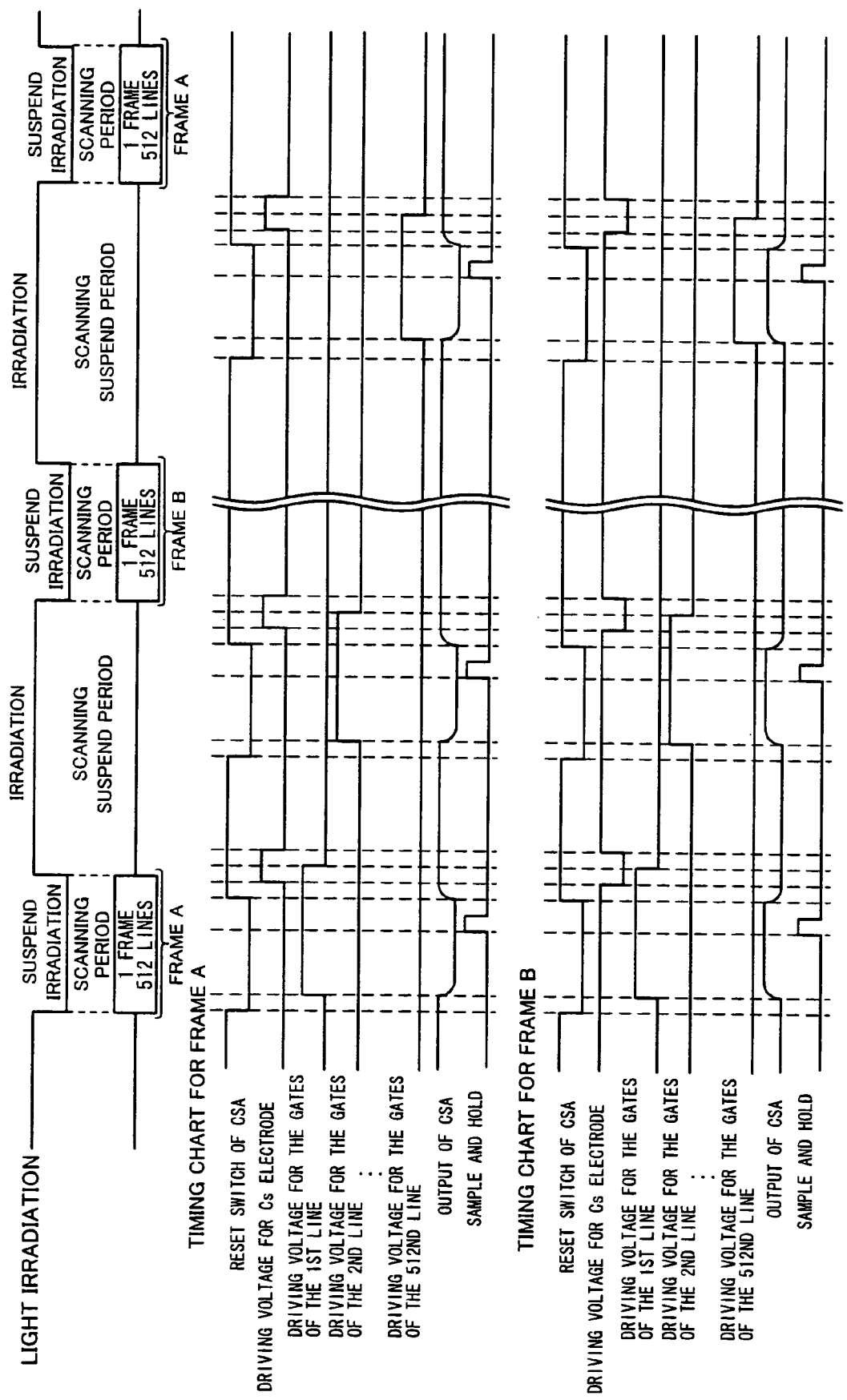
FIG. 7 is a timing chart representing Cs reverse driving of every frame in the image reading device of FIG. 2.

Referring to FIG. 7, a whole sequence of the image reading device 20 is described below.

Note that, in actual driving, the amount of stored charge in the pixel capacitor 22 is influenced by a feedthrough due to a parasitic capacitance Cgs between the gate and source electrodes, and a parasitic capacitance Cgd between the gate and drain electrodes, i.e., the coupling effect of the parasitic capacitances Cgs and Cgd in response to a change in gate signal. However, for convenience of explanation, the influence of such effect is omitted here.

As a rule, the image reading device includes a plurality of gate lines g. In the example of FIG. 7, 512 gate lines are provided.

In the image reading device 20, the charges (drain voltages) generated in a light irradiation period and remaining in the respective pixel capacitors 22 are outputted in a light irradiation suspended period by scanning the gate lines g line by line, thereby sequentially outputting the image information corresponding to the remaining charge in the pixel capacitor 22 of each pixel.

As described, the image reading device 20 of the present embodiment is driven by a sequence as shown in FIG. 1 and FIG. 7, the pixel capacitors 22 alternately receiving a pulse of positive polarity and a pulse of negative polarity on a frame basis.

As a result, even after extended periods of use, the TFT elements 21 and the pixel capacitors 22 do not receive DC-bias stress induced by an input signal to the CS lines. Accordingly, the characteristics of the TFT elements 21 and the pixel capacitors 22 do not change.

Figure 11:
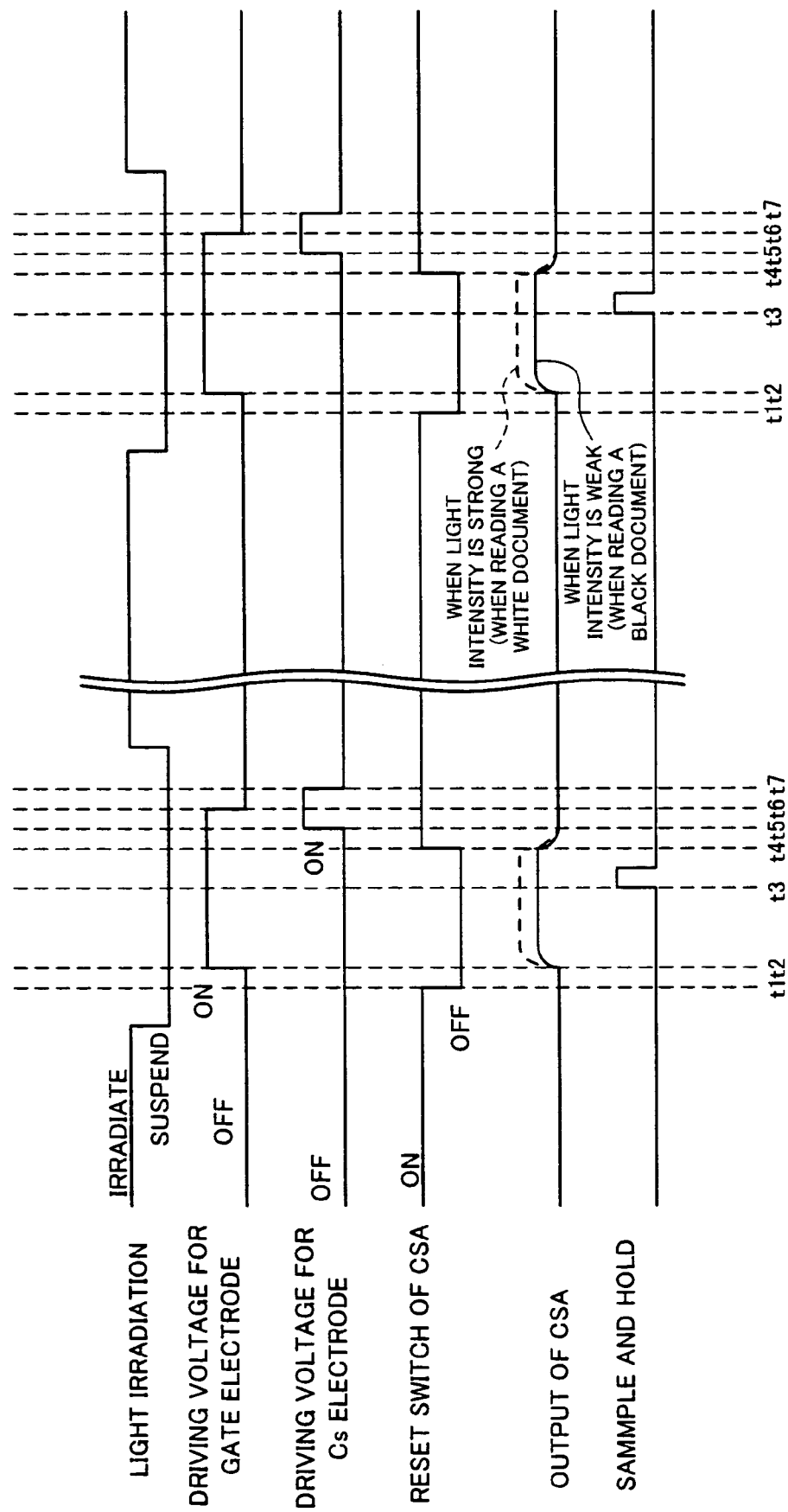
FIG. 11 is a timing chart showing a driving operation of the conventional image reading device.
Figure 12:
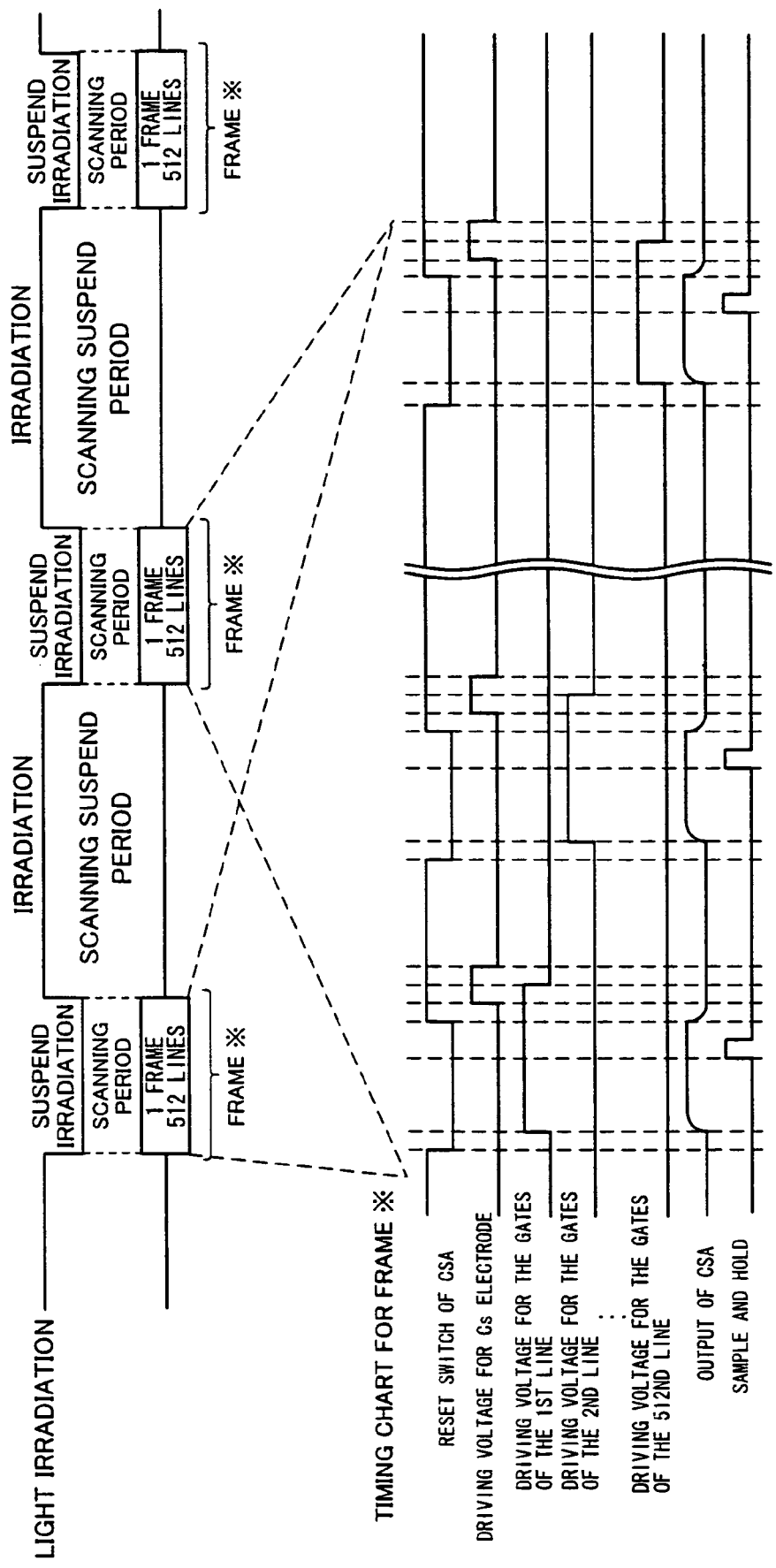
FIG. 12 is a timing chart showing an entire driving operation of the conventional image reading device.

It should be noted that when the image reading device shown in FIG. 2 is driven as a whole according to the timing chart shown in FIG. 12 by maintaining the same polarity for the driving voltage of the Cs electrode throughout the reading cycles (frames) as shown in FIG. 11, the driving voltage of the Cs electrode is either positive or negative throughout the recurrent reading cycles. As a result, after extended periods of use, a DC-bias stress is applied to the TFT elements or capacitors, with the result that electrical characteristics of the TFT elements and capacitors are changed.

In the image reading device 20 of the present embodiment, however, the polarity of the charge stored in the pixel capacitor 22 is reversed every frame, and accordingly the polarity of the charge supplied via the source lines s is also reversed every frame. For this purpose, it is preferable that the CSA 31 accommodates charges of both polarities.

In this way, the output can reflect charges of opposite polarities even when charges of opposite polarities are alternately supplied to the pixel capacitors 22.

Further, the present embodiment described an example in which, in order to reverse the polarity of the charge stored in the pixel capacitor 22, the charge supplied to the Cs electrode has the same amplitude on the positive side and negative side with respect to Vref. However, in actual practice, the charge for pre-charging the pixel capacitor 22 has different amplitudes on the positive side and negative side by the influence of a feedthrough (drawing of charge) due to the parasitic capacitance Cgd generated when the gate is switched from ON to OFF at time t6.

Thus, in order to ensure that no DC-bias stress is applied to the TFT elements 21 or pixel capacitors 22, the amplitudes of the input pulse to the Cs electrode should preferably be asymmetrical on the positive side and negative sides with respect to Vref, taking into account the influence of a feedthrough caused by the parasitic capacitance Cgd, so that substantially the same amount of charge is stored in the pixel capacitor 22 on the positive and negative side.

Note that, the present invention is not just limited to the implementation in which the polarity of the Cs electrode is reversed every cycle. Alternatively, the polarity of the Cs electrode may be reversed every multiple cycles.

Second Embodiment

Figure 8:
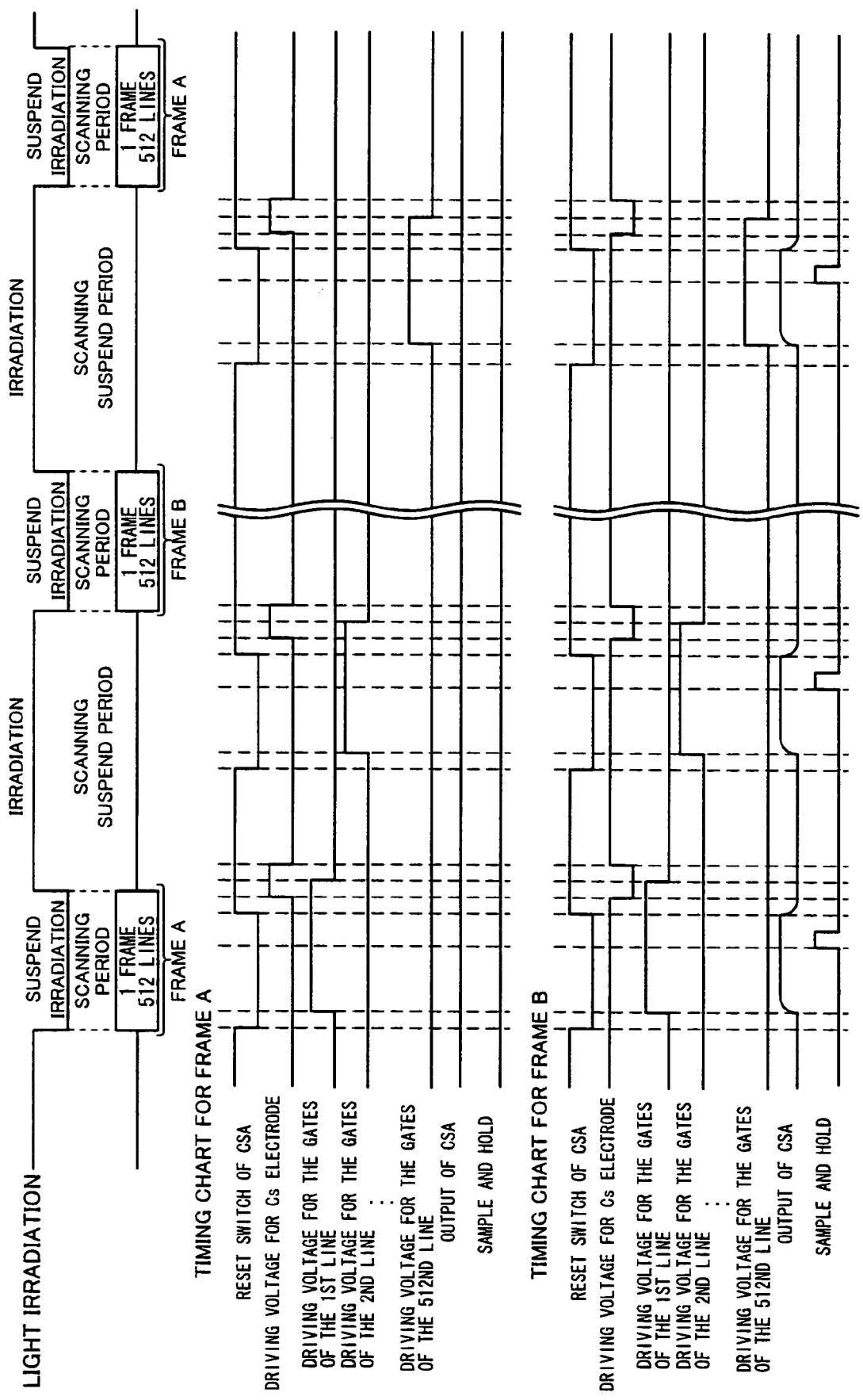
FIG. 8 is a timing chart representing Cs reverse driving in an image reading device according to another embodiment of the present invention.
Figure 9:
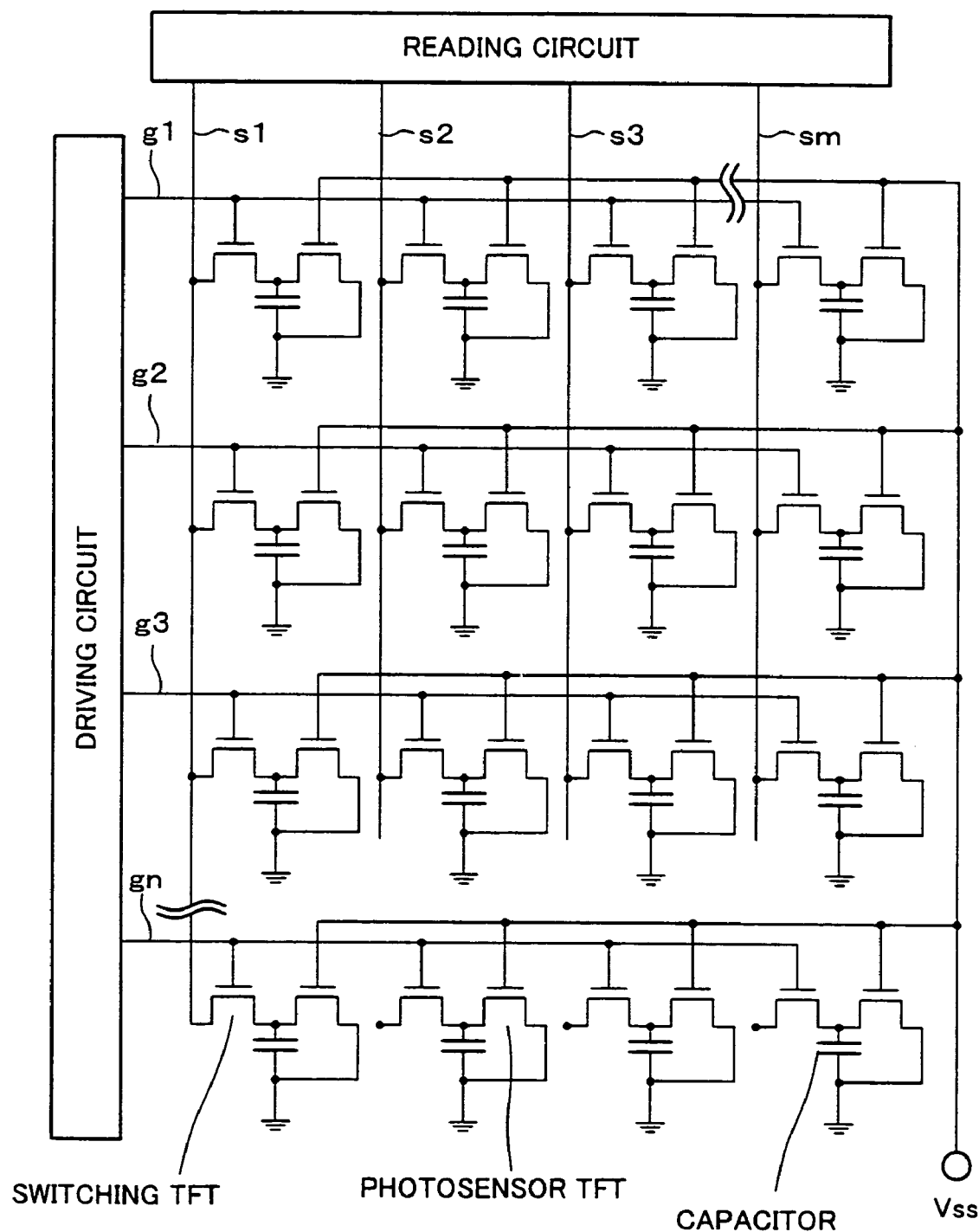
FIG. 9 is a plan view showing a conventional active-matrix image reading device.

Referring to FIG. 8, the following describes an image reading device and an image reading method according to another embodiment of the present invention.

An image reading device of the present embodiment has the same structure as the image reading devices 20 and 20' of the First Embodiment except that the CSA (charge integration amplifier) 31 that accommodates charges of both polarities is adapted to accommodate only one of the polarities.

The image reading device of the present embodiment drives the Cs electrode by a driving sequence shown in FIG. 8.

Specifically, in the image reading device of the present embodiment, even though the input signal to the Cs electrode is of opposite polarities in frame A and frame B, the output value is read only in frame B by sampling and holding, because the CSA accommodates only the positive charge. In frame A, which otherwise reads the negative charge, the CSA produces no output, and no sampling and holding is performed.

By thus reading a document image only in frame B, i.e., by reading a document image once in every two frames, the effects obtained by the image reading device 20 of the First Embodiment can also be obtained with the image reading device provided with the CSA that accommodates only one of the polarities.

It should be note that, in the image reading device of the present embodiment that reads a document image once in every two frames, the A/D converter can allocate its output bits to only one of the polarities, because the CSA accommodates only one of the polarities. This is advantageous in improving gradation performance of the image reading device.

The foregoing First and Second Embodiments described the image reading devices in which each pixel is provided with a single TFT element that serves as a switching thin-film transistor and a photosensor thin-film transistor. However, the present invention is not just limited to this implementation. For example, the image reading method of the present invention is also applicable to an image reading device in which a switching thin-film transistor and a photosensor thin-film transistor are separately provided for each pixel.

In one aspect of the invention, an image reading device includes a photoelectric conversion element having a photosensitive thin-film transistor and a capacitor connected to a drain electrode of the photosensitive thin-film transistor, the image reading device reading an image by detecting an amount of charge stored in the capacitor that varies according to the intensity of light projected onto the thin-film transistor, and operating according to a sequence in which the polarity of the stored charge in the capacitor may be positive or negative with respect to a potential of the source electrode of the thin-film transistor.

As described, the image reading device of the present invention includes a photoelectric conversion element having a photosensitive thin-film transistor and a capacitor connected to a drain electrode of the photosensitive thin-film transistor, and photoelectric conversion amount detecting means for detecting an amount of charge stored in the capacitor that varies according to intensity of light projected on the photosensitive thin-film transistor, and control means for reversing the polarity of the stored charge in the capacitor with respect to a potential of a source electrode of the photosensitive thin-film transistor.

According to this structure, the control section reverses an applied driving voltage to the Cs electrode, for example, every frame, so as to reverse the polarity of the stored charge in the capacitor, thereby reversing the polarity of the stored charge in the capacitor every frame. As a result, a DC-bias stress will not be applied to the thin-film transistor (TFT element) or capacitor, thus realizing an image reading device with good reliability that does not undergo change in electrical characteristics even after extended periods of use.

In conventional image reading devices, the driving voltage applied to the Cs electrode to read a document image maintains the same polarity throughout the reading operation. As a result, a DC-bias stress is applied to the TFT element or capacitor, changing the electrical characteristics of the TFT element or capacitor and thereby causing the problem of reliability in the image reading device.

In order to prevent this problem, the image reading device of the present invention drives the Cs electrode in such a manner as to store charges of both positive and negative polarities in the capacitor. As a result, a DC-bias stress due to an input signal to the Cs electrode will not be applied to the TFT element or capacitor, thus realizing an image reading device with good reliability that does not undergo change in electrical characteristics of the TFT element or capacitor even after extended periods of use.

It is preferable that the control section reverses the polarity of the stored charge in the capacitor every image reading cycle, or every multiple image reading cycles.

By thus reversing the polarity of the stored charge in the capacitor is reversed every image reading cycle or every multiple image reading cycles, a change in electrical characteristic of the TFT element or capacitor is prevented, and an image reading device with good reliability is realized.

It is preferable that the photoelectric conversion amount detecting means includes a charge integration amplifier that detects charges of both positive and negative polarities.

This enables charges of both polarities to be detected, thereby enabling the charge to be read every frame even when the polarity of stored charge in the capacitor is alternately reversed, for example, every image reading cycle. In this way, image information can be obtained for all pixels.

It is preferable that the photoelectric conversion amount detecting means includes a charge integration amplifier that detects a charge of either positive or negative polarity.

In this way, even when the photoelectric conversion amount detecting means can detect only one of the polarities when, for example, the polarity of stored charge in the pixel electrode is alternately reversed, it is still possible to read a document image by detecting the charge every other frame and thereby detecting the charge of the same polarity at all times.

Note that, in this case, the image information obtained is of every other frame. However, the A/D converter can allocate its output bits to only one of the polarities, making it possible to improve gradations. That is, because the number of bits required for the processing is fewer than that for the both polarities, the remaining bits can be used to improve gradations.

As described, an image reading method of the present invention includes: a first step of charging a predetermined amount of charge to a capacitor connected to a drain electrode of a photosensitive thin-film transistor; a second step of discharging the predetermined amount of charge from the capacitor by projecting light onto the photosensitive thin-film transistor while the photosensitive thin-film transistor is OFF; and a third step of detecting an amount of charge stored in the capacitor, the image reading method reading a document image in a cycle of the first through third steps, and the image reading method reversing the polarity of the stored charge in the capacitor every cycle or every multiple cycles of the first through third steps with respect to a potential of a source electrode of the photosensitive thin-film transistor.

According to this method, the control section reverses an applied driving voltage to the Cs electrode every frame or every multiple frames, so as to reverse the polarity of the stored charge in the capacitor, thereby reversing the polarity of the stored charge in the capacitor every frame or every multiple frames. As a result, a DC-bias stress will not be applied to the thin-film transistor (TFT element) or capacitor, thus realizing an image reading method with good reliability that does not undergo change in electrical characteristics even after extended periods of use.

In conventional image reading methods, the driving voltage applied to the Cs electrode to read a document image maintains the same polarity throughout the reading operation. As a result, a DC-bias stress is applied to the TFT element or capacitor, changing the electrical characteristics of the TFT element or capacitor and thereby causing the problem of reliability in the image reading device.

In order to prevent this problem, the image reading method of the present invention drives the Cs electrode in such a manner as to store charges of both positive and negative polarities in the capacitor. As a result, a DC-bias stress due to an input signal to the Cs electrode will not be applied to the TFT element or capacitor, thus maintaining a high level of reliability for the image reading device, by preventing a change in electrical characteristics of the TFT element or capacitor even after extended periods of use.

It is preferable that the third step is carried out every frame, using a charge integration amplifier that detects charges of both positive and negative polarities.

In this way, image information corresponding to a document image can be obtained by reading charge of each pixel, even when the polarity of stored charge in the capacitor is reversed every frame.

It is preferable that the third step is carried out every other frame, using a charge integration amplifier that detects a charge of either positive or negative polarity.

In this way, by reading charge of each pixel every other frame, charge of the same polarity can be obtained even when the polarity of stored charge in the capacitor is reversed every frame. As a result, image information of every other frame can be obtained that corresponds to a document image.

Note that, in this case, the image information obtained is of every other frame. However, the A/D converter can allocate its output bits to only one of the polarities, making it possible to improve gradations. That is, because the number of bits required for the processing is fewer than that for the both polarities, the remaining bits can be used to improve gradations.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. An image reading device comprising:
    a photoelectric conversion element having a photosensitive thin-film transistor and a capacitor connected to a drain electrode of the photosensitive thin-film transistor;
    photoelectric conversion amount detecting means for detecting an amount of charge stored in the capacitor that varies according to intensity of light projected on the photosensitive thin-film transistor; and
    control means for reversing the polarity of the stored charge in the capacitor with respect to a potential of a source electrode of the photosensitive thin-film transistor.

2. The image reading device as set forth in claim 1, wherein the control means reverses the polarity of the stored charge in the capacitor every image reading cycle or every multiple image reading cycles.

3. The image reading device as set forth in claim 1, wherein the photoelectric conversion amount detecting means includes a charge integration amplifier that detects charges of both positive and negative polarities.

4. The image reading device as set forth in claim 1, wherein the photoelectric conversion amount detecting means includes a charge integration amplifier that detects a charge of either positive or negative polarity.

5. The image reading device as set forth in claim 1, wherein, in order to reverse the polarity of the stored charge in the capacitor, the control means controls a voltage applied to an electrode of the capacitor opposite an electrode connected to the drain electrode of the photosensitive thin-film transistor.

6. The image reading device as set forth in claim 1, wherein:
    the photoelectric conversion amount detecting means includes a charge integration amplifier; and
    in order to reverse the polarity of the stored charge in the capacitor, the control means controls a reference voltage of the charge integration amplifier.

7. An image reading device comprising:
    a photoelectric conversion element including a photosensitive thin-film transistor and a capacitor connected to a drain electrode of the photosensitive thin-film transistor;
    a photoelectric conversion amount detecting section for detecting an amount of charge stored in the capacitor that varies according to intensity of light projected on the photosensitive thin-film transistor; and
    a control section for reversing the polarity of the stored charge in the capacitor with respect to a potential of the source electrode of the photosensitive thin-film transistor.

8. The image reading device of claim 1, wherein the photoelectric conversion amount detecting means detects an amount of remaining charge stored in the capacitor that varies according to intensity of light projected on the photosensitive thin film transistor.

9. The image reading device of claim 1, wherein the control means reverses the polarity of the previously stored charge in the capacitor.

10. The image reading device of claim 1, wherein the control means is for reversing the polarity of the stored charge in the capacitor with respect to the potential of the source electrode of the photosensitive thin-film transistor so that the polarity of charge read out via a source line electrically connected to the source electrode is positive in certain reading cycles and negative in other reading cycles.

11. The image reading device of claim 10, wherein the photoelectric conversion amount detecting means comprises a charge integration circuit whose output changes polarity every image reading cycle or every multiple image reading cycle for pixels receiving light.

* * * * *